(12) United States Patent
Yu et al.

(10) Patent No.: US 6,482,702 B1
(45) Date of Patent: Nov. 19, 2002

(54) METHOD OF FORMING AND RECOGNIZING AN IDENTIFICATION MARK FOR READ-ONLY MEMORY

(75) Inventors: Chi-Hua Yu, Kaohsiung (TW); Hsiao-Ying Yang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/093,486

(22) Filed: Mar. 11, 2002

(51) Int. Cl.[7] ............................................. H01L 2/8236
(52) U.S. Cl. ...................................... 438/278; 438/401
(58) Field of Search ................................. 438/130, 275, 438/276, 277, 278, 401

(56) References Cited

U.S. PATENT DOCUMENTS

| 5,051,374 A | * | 9/1991 | Kagawa et al. ............. 438/401 |
| 5,576,236 A | | 11/1996 | Chang et al. ................. 437/48 |
| 5,668,030 A | * | 9/1997 | Chung et al. ................ 438/401 |
| 5,693,551 A | * | 12/1997 | Su et al. ...................... 438/278 |
| 6,103,561 A | * | 8/2000 | Seshadri et al. ............. 438/276 |

* cited by examiner

Primary Examiner—Chandra Chaudhari
(74) Attorney, Agent, or Firm—Intellectual Property Solutions, Incorporated

(57) ABSTRACT

A method of forming and recognizing an identification mark for read-only memory. First, a first patterned resist layer is formed on a semiconductor substrate having an insulating region and a device region thereon by a code mask having code and identification mark patterns, and the identification mark pattern is over the insulating region. Next, ion implantation is performed to code in the device region. Thereafter, a second patterned resist layer is formed on the first patterned resist layer by a common mask to expose the entire identification mark pattern of the first patterned resist layer only. The identification mark pattern is then transferred to the insulating region by dry etching. Finally, the substrate having a clear identification mark is placed in an optical microscope for identification by an operator.

16 Claims, 8 Drawing Sheets

METHOD OF FORMING AND RECOGNIZING AN IDENTIFICATION MARK FOR READ-ONLY MEMORY

BACKGROUND OF THE INVENTION

1. Field of the Invention

The present invention relates to an identification mark. In particular, the present invention relates to a method of forming and recognizing an identification mark for read-only memory (ROM), the application of which reduces the number of masks needed in the manufacturing process, thereby reducing manufacturing cost.

2. Description of the Related Art

Conventionally, in the manufacturing process of mask read-only memory (hereinafter referred to as a MASK ROM) cells, there is an identification mark formed on each chip having MASK ROM cells to easily distinguish each client's product or products with different program codes. However, in the conventional method of manufacturing MASK ROM cells, it is necessary to prepare extra mark masks having different identification mark patterns for each chip in addition to code masks to code the MASK ROM cells by ion implantation. Accordingly, the conventional method needs a large number of masks for identification marks. As a result, manufacturing cost is significantly increased.

FIG. 1 is a top-view diagram showing a part of a chip having MASK ROM cells and an identification mark according to the prior art. In FIG. 1, number 10 represents a semiconductor substrate such as a silicon chip. Number 10a represents a device region on which MASK ROM cells is deposed. Number 12 represents an insulating region having an insulator such as field oxide (FOX) or shallow trench isolation (STI) oxide. Number 12a represents an identification mark such as "V1". Numbers 14 and 16 represent a word line and a bit line of the MASK ROM respectively.

FIGS. 2a to 2e are section diagrams along the A—A line in FIG. 1 showing a conventional method of forming an identification mark for MASK ROM. In FIG. 2a, a semiconductor substrate 10 having an insulating region 12 and a device region 10a thereon is provided, and a word line 14 of the MASK ROM (not shown) is formed on the device region 10a.

In FIG. 2b, after a code mask (not shown) is used for photolithography, a patterned resist layer 18 is formed on the insulating region 12 and the device region 10a to expose the word line 14 and a part of the device region 10a. Thereafter, ion implantation is performed to code the MASK ROM. The implanting depth of the device region 10a underlying the word line 14 is shallower than that of the exposed device region 10a near the word line 14. Mark "+" represents the doped element.

In FIG. 2c, after the patterned resist layer 10 is stripped, another patterned resist layer 20 is formed on the insulating region 12 and the device region 10a using a mark mask (not shown) to expose the insulating region 12. The top view pattern above the exposed insulating region 12 is "V1".

In FIG. 2d, the exposed insulating region 12 is etched using the resist layer 20 as a mask to transfer the pattern "V1" to the insulating region 12 and an identification mark 12a is then formed. In FIG. 2e, the patterned resist layer 20 is stripped to complete the identification mark 12a fabrication.

As mentioned above, since mark masks are manufactured with different clients or different program codes, it is necessary to prepare a large number of mark masks for MASK ROM.

Seeking to solve this problem, a process for coding and code marking a read-only memory device is disclosed in U.S. Pat. No. 5,576,236. A mark is formed on a buffer layer using a code mask having identification mark pattern. This method only needs once photolithography and reduces the number of masks thereby reducing the cost. However, this method increases the number of process steps by forming an extra buffer layer. In addition, the mark is formed on the buffer layer, which is thin. Thus, the identification mark disappears or is difficult to recognize easily after the follow deposition steps.

SUMMARY OF THE INVENTION

An object of the present invention is to provide a method of forming an identification mark for read-only memory in which a common mask is used to reduce the number of masks used in the manufacturing process thereby reducing the manufacturing cost.

Therefore, the present invention provides a method of forming an identification mark for MASK ROM. The method uses code masks having identification mark patterns and a common mask to replace code masks and mark masks. Thus, the number of the masks for MASK ROM is reduced. Moreover, the identification mark is formed in the thicker field oxide or STI oxide to prevent disappearance of the mark. The mark can be recognized easily using an optical microscope (OM).

In accordance with the object of this invention, a method of forming an identification mark for read-only memory includes the steps of: providing a semiconductor substrate having an insulating region and a device region thereon; forming a first patterned resist layer on the insulating region and the device region by a first mask having an identification mark pattern over the insulating region; performing ion implantation to code in the device region; forming a second patterned resist layer on the first patterned resist layer by a second mask to expose the entire identification mark pattern of the first patterned resist layer only; etching the insulating region to transfer the identification mark pattern to the insulating region; and removing the first and the second patterned resist layers. Moreover, the insulating region is composed of field oxide or shallow trench isolation oxide and the device region is composed of at least one mask read-only memory. The first mask is a code mask further including a code pattern over the device region. The second mask is a common mask having an opening pattern to expose the identification mark pattern of the first resist layer only. The ion implantation can be performed using boron.

It is another object of the present invention is to provide a method of recognizing a chip having read-only memory cells in which a clear identification mark is formed on the insulating region, making recognition of the mark easy using optical equipment.

Accordingly, a method of recognizing a chip having read-only memory cells includes steps of: providing a semiconductor substrate having an insulating region and a device region thereon; forming a first patterned resist layer on the insulating region and the device region by a first mask having an identification mark pattern and a code pattern over the insulating region and the device region respectively; forming a second patterned resist layer on the first patterned resist layer by a second mask to expose the entire identification mark pattern of the first patterned resist layer only; etching the insulating region to transfer the identification mark pattern to the insulating region; removing the first and the second patterned resist layers to obtain an identification mark; and identifying the identification mark formed on the insulating region by optical equipment. Moreover, the method further includes the step of performing ion implantation to code in the device region after the first patterned resist layer is formed. The optical equipment can be an optical microscope.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

FIGS. 3 and 4a to 4e show a method of forming an identification mark for MASK ROM according to the present invention.

Figure 1:
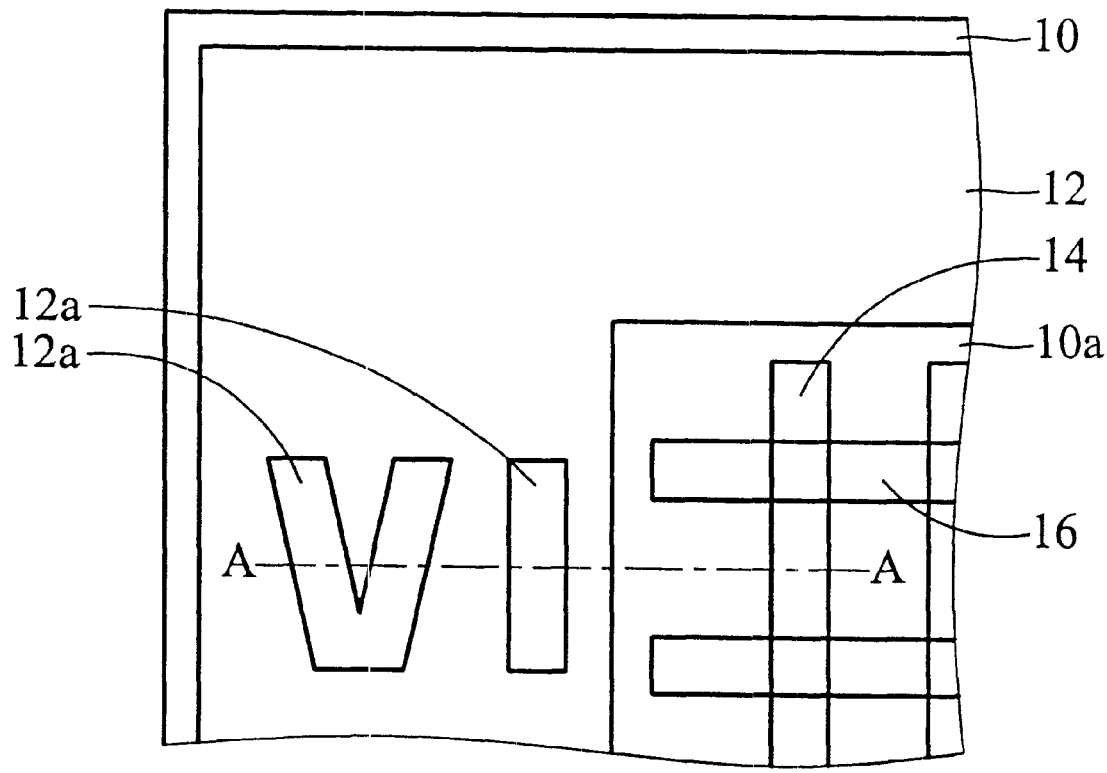
FIG. 1 is a top-view diagram showing a part of chip having MASK ROM cells and an identification mark according to the prior art.
Figure 2A:
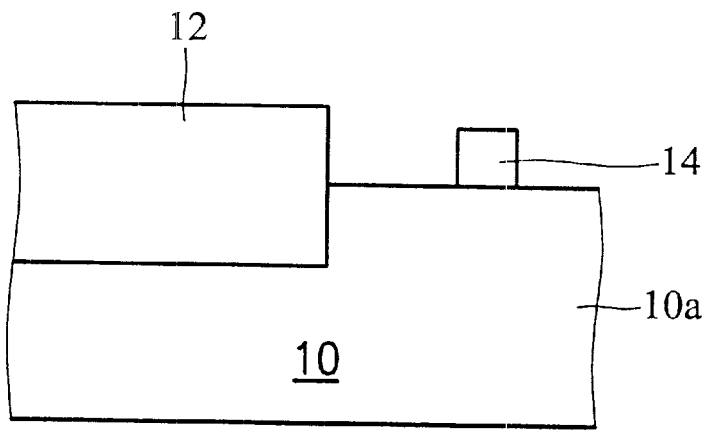
FIGS. 2a to 2e are section diagrams along the A—A line in FIG. 1 showing a method of forming an identification mark for MASK ROM according to the prior art.
Figure 2B:
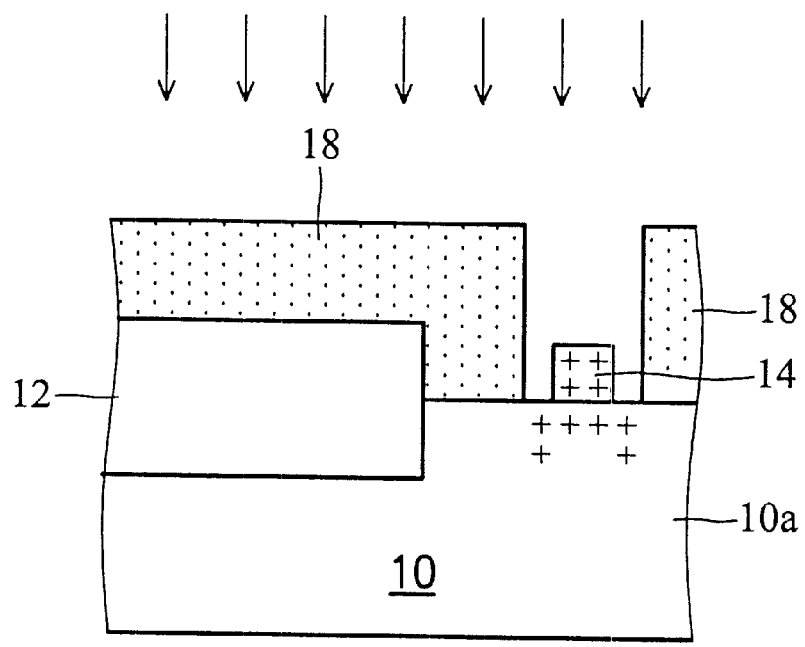
Figure 2C:
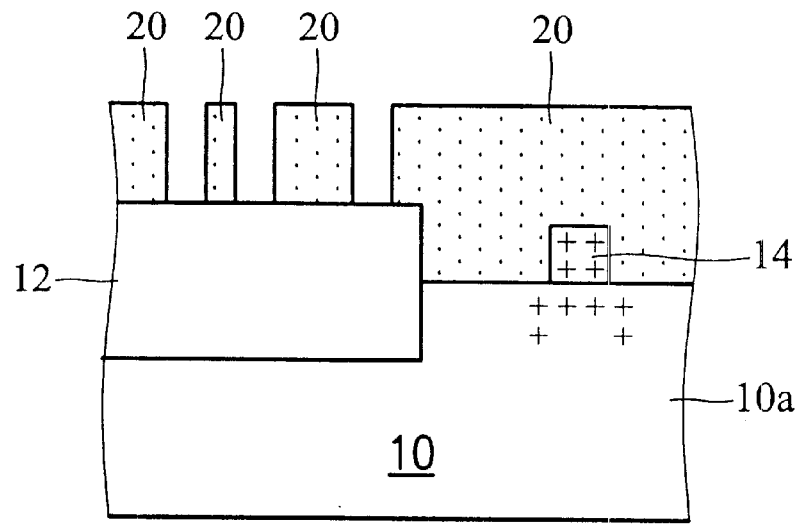
Figure 2D:
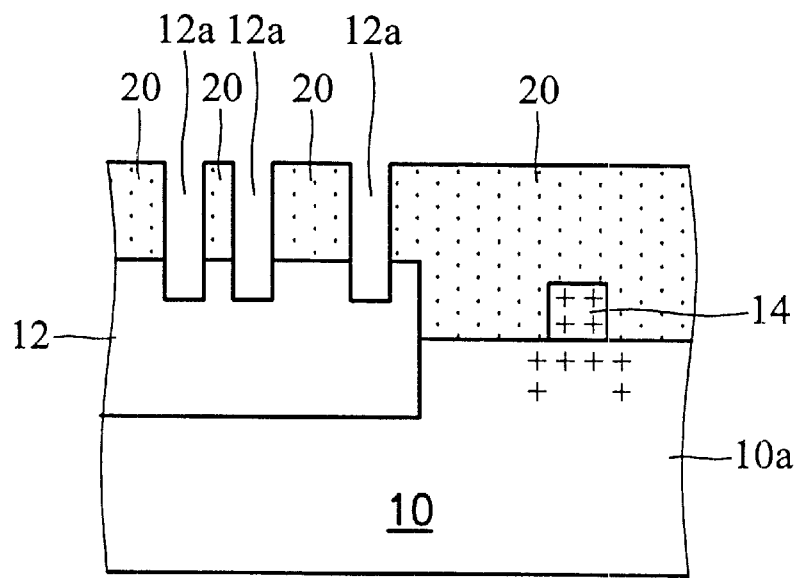
Figure 2E:
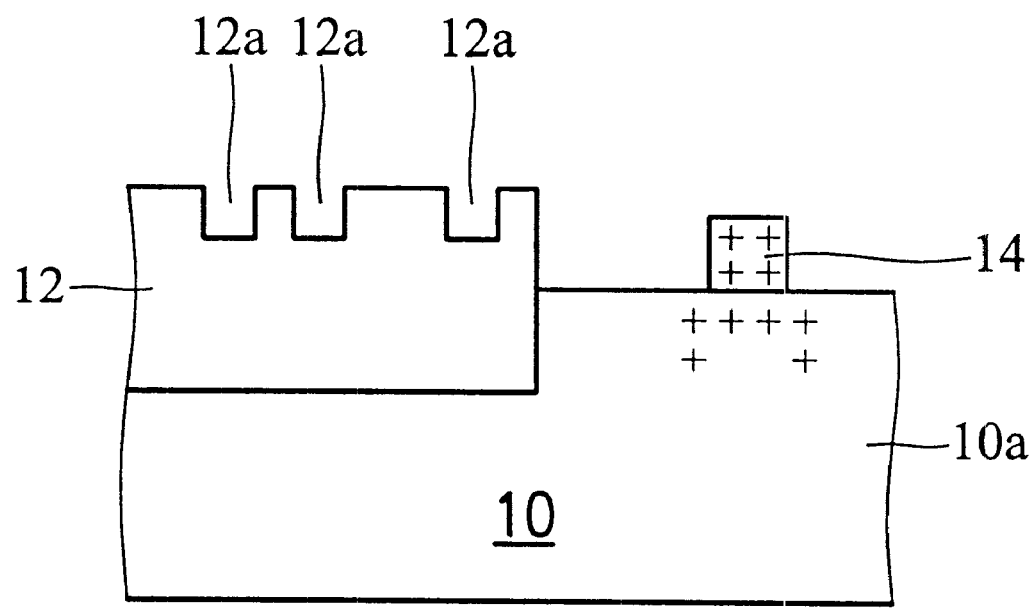
Figure 3:
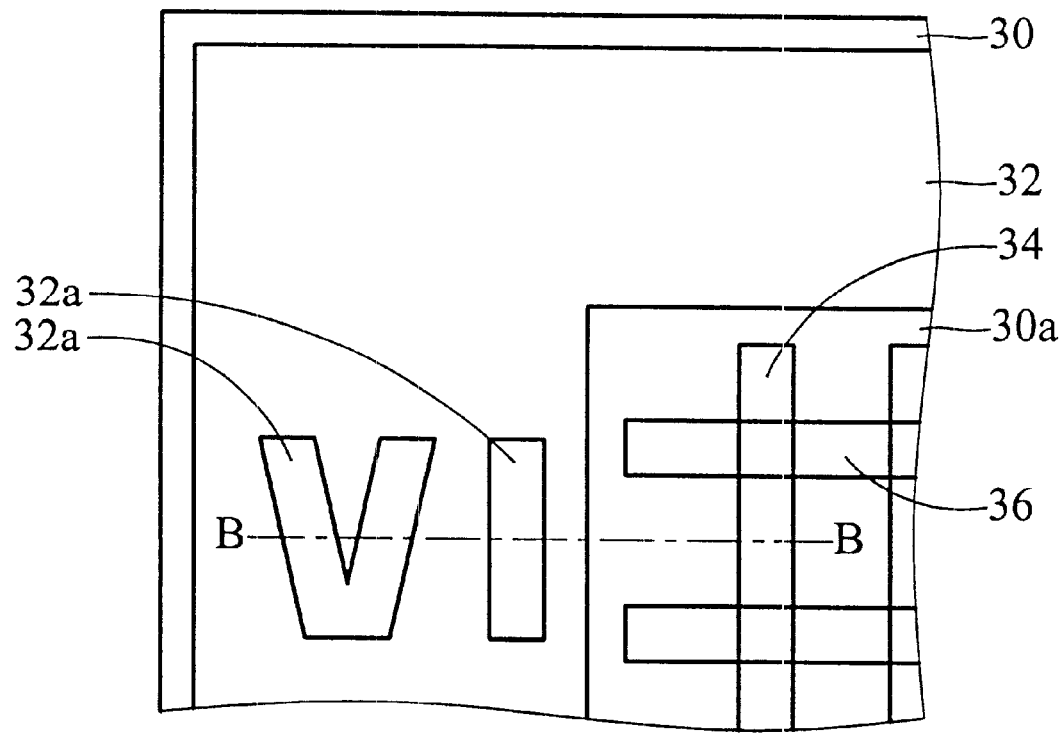
FIG. 3 is a top-view diagram showing a part of chip having MASK ROM cells and an identification mark according to the present invention.

FIG. 3 is a top-view diagram showing a part of chip having MASK ROM cells and an identification mark according to the present invention. In FIG. 3, number 30 represents a semiconductor substrate such as a silicon chip. Number 30a represents a device region on which MASK ROM cells can be disposed. Number 32 represents an insulating region having an insulator such as field oxide (FOX) or shallow trench isolation (STI) oxide that are formed by local oxidation of silicon (LOCOS) and shallow trench isolation (STI) respectively. Number 32a represents an identification mark such as "V1". Numbers 34 and 36 represent a word line and a bit line of MASK ROM respectively.

Figure 4A:
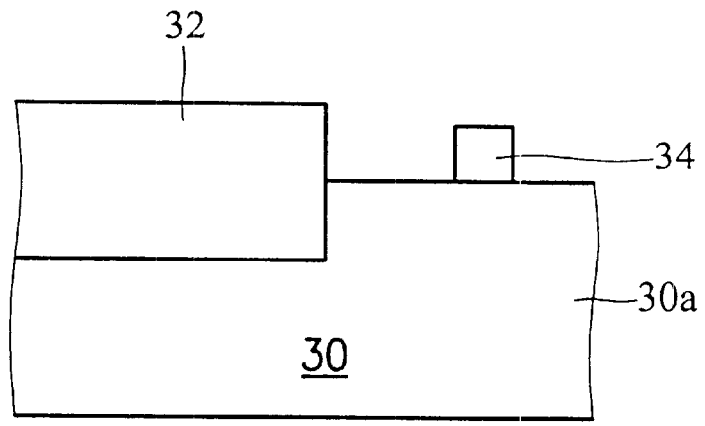
FIGS. 4a to 4e are section diagrams along the B—B line in FIG. 3 showing a method of forming an identification mark for MASK ROM according to the present invention.

FIGS. 4a to 4e are section diagrams along the B—B line in FIG. 3 showing a method of forming an identification mark for MASK ROM. In FIG. 4a, a semiconductor substrate 30 having an insulating region 32 and a device region 30a thereon is provided. In addition, a word line 34 of the MASK ROM such as a gate structure composed of a gate oxide (not shown) and a gate (not shown) is formed on the device region 30a.

Figure 4B:
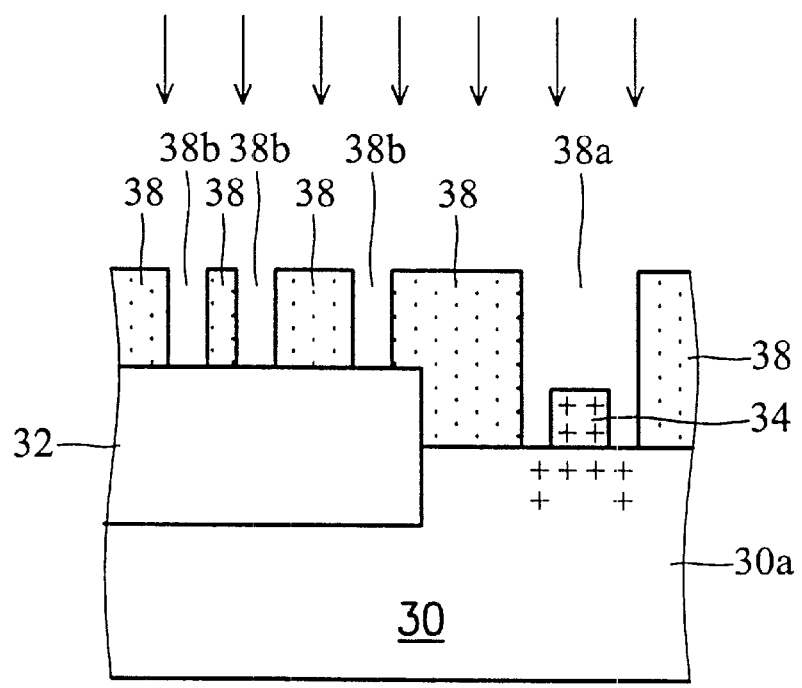

In FIG. 4b, a patterned resist layer 38 is formed on the insulating region 32 and the device region 30a by photolithography using a code mask (not shown) having an identification mark pattern and a code pattern. In the patterned resist layer 38, the identification mark pattern 38b (i.e. "V1") is over the insulating region 32 and a code pattern 38a is over the device region 30a. It is understood that the mark pattern 38b is changed according to different clients or different code patterns. After the patterned resist layer 38 is formed, ion implantation is performed on the device region 30a using the resist layer 38 as a mask. Conventional methods for coding are implantation. For example, the element doped in the word line 34 and device region 30a by ion implantation can be boron. Also, the implanting depth of the device region 30a underlying the word line 34 is shallower than that of the exposed device region 30a near the word line 34. Mark "+" represents the doped element.

Figure 4C:
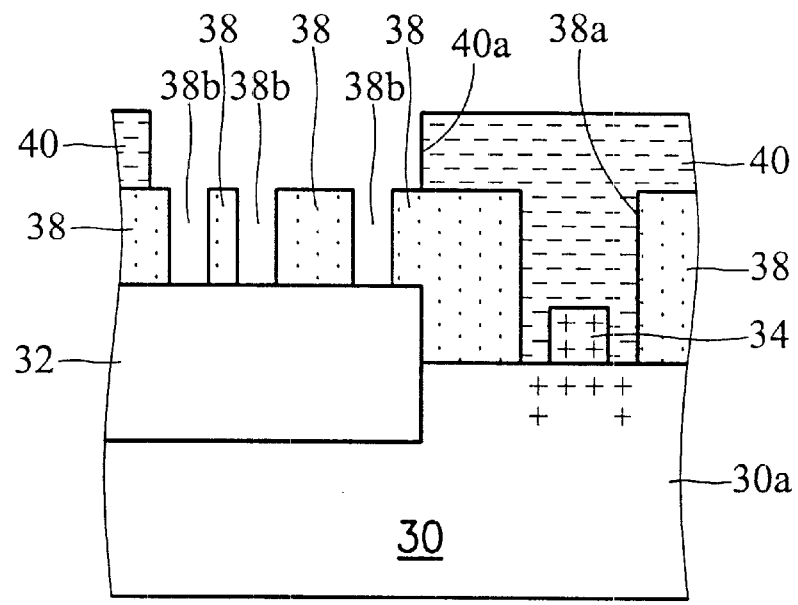

In FIG. 4c, since the patterned resist layer 38 is cured after ion implantation is performed, another patterned resist layer 40 can formed immediately on the patterned resist layer 38 by photolithography using a common mask (not shown) having an opening pattern. Through the patterned resist layer 40, the entire identification mark pattern 38b of the patterned resist layer 38 is exposed while the code pattern 38a is not.

Figure 4D:
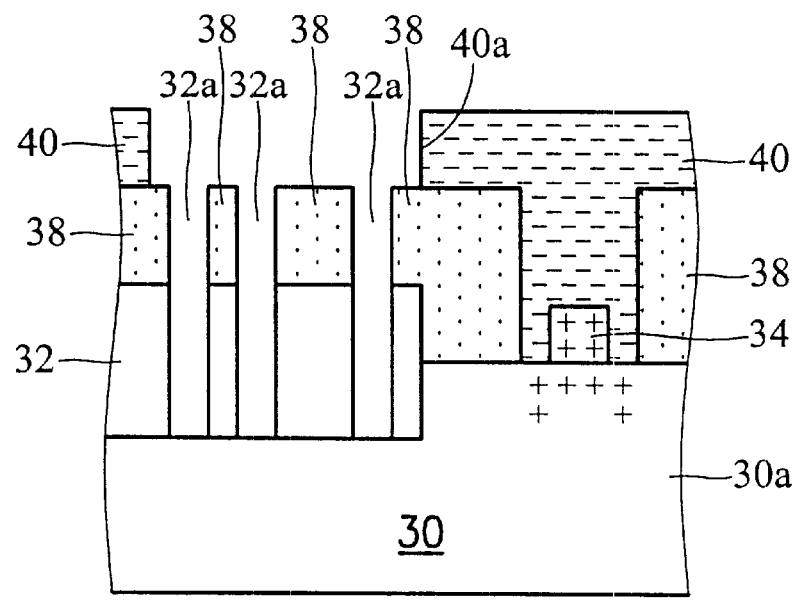
Figure 4E:
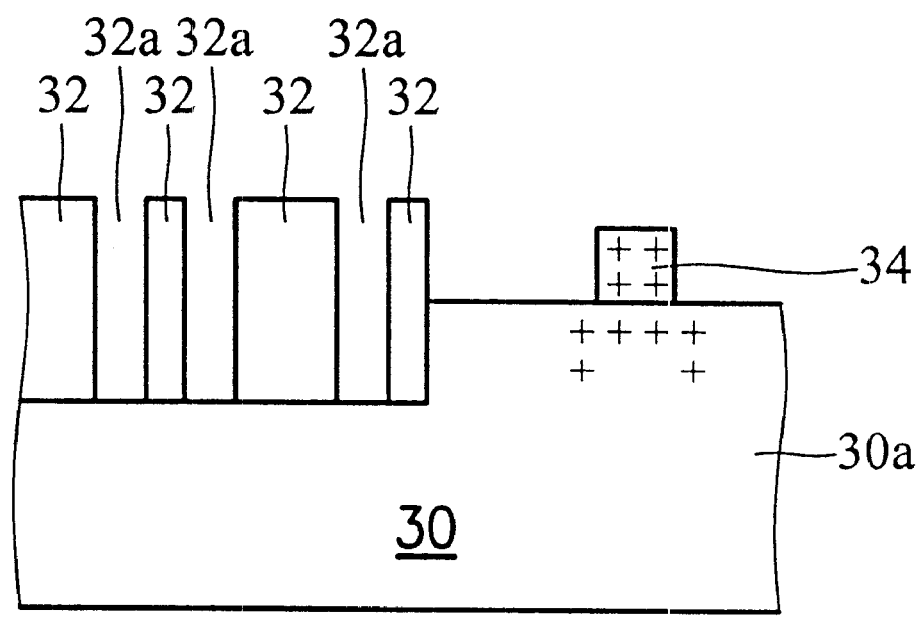

In FIG. 4d, the insulating region 32 is dry etched using the patterned resist layers 38 and 40 as masks to expose the substrate 30. An identification mark pattern 32a having greater depth is formed due to the thicker insulation layer 32(e.g. FOX or STI oxide). That is, a clear mark 32a is formed on the chip 30. The mark 32a is difficult to become indistinct or disappear after subsequent deposition process steps. In FIG. 4e, the patterned resist layers 38 and 40 are stripped to complete the identification mark 32a fabrication.

In the present invention, in order to distinguish products having different identification marks, a method of recognizing a chip having read-only memory cells is provided. First, an identification mark is formed for MASK ROM according to the present invention. Thereafter, the chip having identification mark 32a is placed in optical equipment such as an optical microscope. An operator can identify the mark 32a formed in the insulating region 32 via the optical microscope.

According to the present invention, a common mask and respective code masks are used to manufacture MASK ROM chips having identification marks. Compared to the conventional method using mark masks and code masks, the present invention uses a reduced number of the masks. Moreover, since the identification mark is formed in the thicker insulating layer (i.e. FOX or STI oxide) to obtain a greater pattern depth, it is difficult for the mark to disappear after the follow deposition process steps. Accordingly, the mark can be recognized easily using an optical microscope.

Finally, while the invention has been described by way of example and in terms of the preferred embodiment, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming an identification mark for read-only memory, comprising steps of:

providing a semiconductor substrate having an insulating region and a device region thereon;

forming a first patterned resist layer on the insulating region and the device region by a first mask having an identification mark pattern over the insulating region;

performing ion implantation to code in the device region;

forming a second patterned resist layer on the first patterned resist layer by a second mask to expose the entire identification mark pattern of the first patterned resist layer only;

etching the insulating region to transfer the identification mark pattern to the insulating region; and removing the first and the second patterned resist layers to obtain an identification mark.

2. The method as claimed in claim 1, wherein the insulating region is composed of field oxide or shallow trench isolation oxide.

3. The method as claimed in claim 1, wherein the device region is composed of at least one mask read-only memory.

4. The method as claimed in claim 1, wherein the first mask is a code mask and further comprises a code pattern over the device region.

5. The method as claimed in claim 1, wherein the ion implantation is performed using boron.

6. The method as claimed in claim 1, wherein the second mask is a common mask having an opening pattern to expose the identification mark pattern of the first resist layer only.

7. The method as claimed in claim 1, wherein the insulating region is etched by dry etching.

8. The method as claimed in claim 2, wherein the insulating region is formed by local oxidation of silicon or shallow trench isolation.

9. A method of recognizing a chip having read-only memory cells, comprising steps of:

providing a semiconductor substrate having an insulating region and a device region thereon;

forming a first patterned resist layer on the insulating region and the device region by a first mask having an identification mark pattern and a code pattern over the insulating region and the device region respectively;

forming a second patterned resist layer on the first patterned resist layer by a second mask to expose the entire identification mark pattern of the first patterned resist layer only;

etching the insulating region to transfer the identification mark pattern to the insulating region;

removing the first and the second patterned resist layers to obtain an identification mark; and identifying the identification mark formed on the insulating region using optical equipment.

10. The method as claimed in claim 9, wherein the insulating region is composed of field oxide or shallow trench isolation oxide.

11. The method as claimed in claim 9, wherein the device region is composed of at least one mask read-only memory.

12. The method as claimed in claim 9, further comprises the step of performing ion implantation to code in the device region after the first patterned resist layer is formed.

13. The method as claimed in claim 9, wherein the insulating region is etched by dry etching.

14. The method as claimed in claim 9, wherein the optical equipment is an optical microscope.

15. The method as claimed in claim 10, wherein the insulating region is formed by local oxidation of silicon or shallow trench isolation.

16. The method as claimed in claim 12, wherein the ion implantation is performed using boron.

* * * * *